United States Patent
Micheloni et al.

(10) Patent No.: US 8,707,122 B1
(45) Date of Patent: Apr. 22, 2014

(54) NONVOLATILE MEMORY CONTROLLER WITH TWO-STAGE ERROR CORRECTION TECHNIQUE FOR ENHANCED RELIABILITY

(75) Inventors: Rino Micheloni, Turate (IT); Peter Z. Onufryk, Flanders, NJ (US); Alessia Marelli, Dalmine (IT); Christopher I. W. Norrie, San Jose, CA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 400 days.

(21) Appl. No.: 13/023,336

(22) Filed: Feb. 8, 2011

(51) Int. Cl.
*H03M 13/00* (2006.01)

(52) U.S. Cl.
USPC .......... 714/752; 714/758; 714/763; 714/782; 714/764

(58) Field of Classification Search
USPC ................................. 714/752, 758, 763, 782
See application file for complete search history.

(56) References Cited

U.S. PATENT DOCUMENTS

| | | |
|---|---|---|
| 6,539,515 B1 | 3/2003 | Gong |
| 7,206,992 B2 | 4/2007 | Xin |
| 7,237,183 B2 | 6/2007 | Xin |
| 8,219,894 B2 | 7/2012 | Au et al. |
| 8,245,117 B1 | 8/2012 | Wu |
| 2004/0181735 A1 | 9/2004 | Xin |
| 2009/0327802 A1* | 12/2009 | Fukutomi et al. ................ 714/6 |

OTHER PUBLICATIONS

NVM Express, Revision 1.0; Intel Corporation; Mar. 1, 2011.

* cited by examiner

*Primary Examiner* — Guy Lamarre
(74) *Attorney, Agent, or Firm* — Kenneth Glass; Stanley J. Pawlik; Glass & Associates

(57) ABSTRACT

A nonvolatile memory controller generates an error correction code for each data unit in a data stripe and generates a parity unit based on the data units of the data stripe. If a data unit of the data stripe has a number of data bit errors not exceeding the error correction capacity of the nonvolatile memory controller, the nonvolatile memory controller corrects any data bit errors in the data unit based on the error correction code of the data unit. Otherwise, if a data unit of the data stripe has a number of data bit error exceeding the error correction capacity of the nonvolatile memory controller, the nonvolatile memory controller recovers the data unit based on the other data units of the data stripe and the parity unit.

20 Claims, 8 Drawing Sheets

| 305a Data Unit Address | 305b Data Unit Address | ... | 305c Data Unit Address | 310 Parity Unit Address |
|---|---|---|---|---|

| | |
|---|---|
| 405 — 305a Data Unit Address | 410 Descriptor Pointer |
| 405 — 305b Data Unit Address | 410 Descriptor Pointer |
| ... | ... |
| 405 — 305c Data Unit Address | 410 Descriptor Pointer |
| 405 — 310 Parity Unit Address | 410 Descriptor Pointer |

NONVOLATILE MEMORY CONTROLLER WITH TWO-STAGE ERROR CORRECTION TECHNIQUE FOR ENHANCED RELIABILITY

CROSS-REFERENCES TO RELATED APPLICATIONS

The present application is related to co-pending U.S. patent application Ser. No. 12/913,716 filed on Oct. 27, 2010 and entitled "BCH Data Correction System and Method," which is incorporated herein by reference in its entirety.

BACKGROUND

A flash storage system typically includes a flash controller and a flash memory. The flash controller manages data stored in the flash memory and transfers data between the flash memory and a host computer. In many flash storage systems, the flash controller includes an error correction circuit for detecting and correcting data bit errors in data stored in the flash memory. In this way, the error correction circuit improves reliability of the flash storage system.

One type of error correction circuit often employed in a flash storage controller is a Bose-Chaudhuri-Hochquenghem (BCH) error correction circuit. The BCH error correction circuit includes a syndrome generator, a locator polynomial generator, a search module, and a correction module. The syndrome generator generates syndromes based on a data unit, and the locator polynomial generator generates a locator polynomial based on the syndromes. The locator polynomial has a number of roots equal to the degree of the locator polynomial. Moreover, each of the roots may be used to locate a data bit error in the data unit. The search module locates data bit errors in the data unit by analyzing the roots of the locator polynomial. The correction module corrects the data bit errors in the data unit. In this way, the BCH correction circuit corrects a number of data bit errors equal to the degree of the locator polynomial generated by the BCH correction circuit. Moreover, the BCH error correction circuit has an error correction capacity defined by the maximum degree of a locator polynomial the locator polynomial generator is capable of generating.

Although BCH error correction circuits have been successfully employed to correct data bit errors in flash storage systems, in some applications the number of data bit errors occurring in a data unit stored in a flash storage system exceeds the error correction capacity of the BCH error correction circuit in the flash storage system.

SUMMARY

In various embodiments, a nonvolatile memory controller includes an error correction module and a data recovery module. The error correction module receives a data stripe including a number of data units and generates an error correction code for each data unit in the data stripe. The data recovery module generates a parity unit for the data stripe based on data units of the data stripe. If a data unit of the data stripe has a number of data bit errors not exceeding an error correction capacity of the error correction module, the error correction circuit corrects the data bit errors in the data unit based on the error correction code of the data unit. Otherwise, if a data unit of the data stripe has a number of data bit error exceeding the error correction capacity of the error correction module, the data recovery module recovers the data unit based on the other data units of the data stripe and the parity unit of the data stripe. Because the error correction circuit corrects data bit errors in a data unit up to the error correction capacity of the error correction module and the data recovery module recovers a data unit if the number of data bit errors in the data unit exceeds the error correction capacity of the error correction module, the nonvolatile memory controller has a higher reliability than other nonvolatile memory controllers not capable of performing both error correction and data recovery on a data stripe.

A nonvolatile memory system, in accordance with one embodiment, includes an error correction module, a data recovery module, and a nonvolatile memory module. The nonvolatile memory module is coupled to the error correction module and the data recovery module. The error correction module is configured to receive a data stripe including data units and to generate an error correction code for each data unit of the data stripe for correcting data bit errors in the data unit. The data recovery module is configured to generate a parity unit for the data stripe based on the data units of the data stripe for recovering a data unit of the data stripe based on other data units of the data stripe and the parity unit. The nonvolatile memory module is configured to store the data stripe, the parity unit, and the error corrections codes.

In a further embodiment, the nonvolatile memory system includes a data management module configured to receive data units and to generate the data stripe by aggregating a number of the data units into the data stripe. In some embodiments, the error correction module includes error correction circuits. Each of the error correction circuits is configured to generate an error correction code of a data unit in the data stripe. In some embodiments, the nonvolatile memory module includes nonvolatile memory units configured to store the data stripe, the parity unit, and the error corrections codes.

A method, in accordance with one embodiment, includes generating error correction codes for data units of a data stripe by an error correction module of a nonvolatile memory system. The method also includes generating a parity unit based on the data units of the data stripe by a data recovery module of the nonvolatile memory system. Further, the method includes detecting a number of data bit errors in a data unit of the data stripe and determining whether the number of data bit errors in the data unit exceeds an error correction capacity of the error correction module. Additionally, the method includes correcting the data bit errors in the data unit by the error correction module based on the error correction code of the data unit if the number of data bit errors in the data unit does not exceed the error correction capacity of the error correction module. The method also includes recovering the data unit by the data recovery module of the nonvolatile memory system based on the other data units of the data stripe and the parity unit if the number of data bit errors in the data unit exceeds the error correction capacity of the error correction module. Because the method corrects data bit errors in a data unit up to the error correction capacity of the error correction module and recovers a data unit if the number of data bit errors in the data unit exceeds the error correction capacity of the error correction module, the nonvolatile memory controller has a higher reliability than nonvolatile memory controllers not employing the method.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 3 is a block diagram of a data stripe descriptor, in accordance with an embodiment of the present invention;

FIG. 4 is a block diagram of data stripe lookup table, in accordance with an embodiment of the present invention;

DETAILED DESCRIPTION

In various embodiments, a nonvolatile memory controller includes an error correction module and a data recovery module. The error correction module generates an error correction code for each data unit of a data stripe and corrects any data bit errors in the data units up to an error correction capacity of the error correction module. If a data unit of the data stripe has a number of data bit error exceeding the error correction capacity of the error correction module, the data recovery recovers the data unit based on the other data units of the data stripe and the parity unit.

Figure 1:
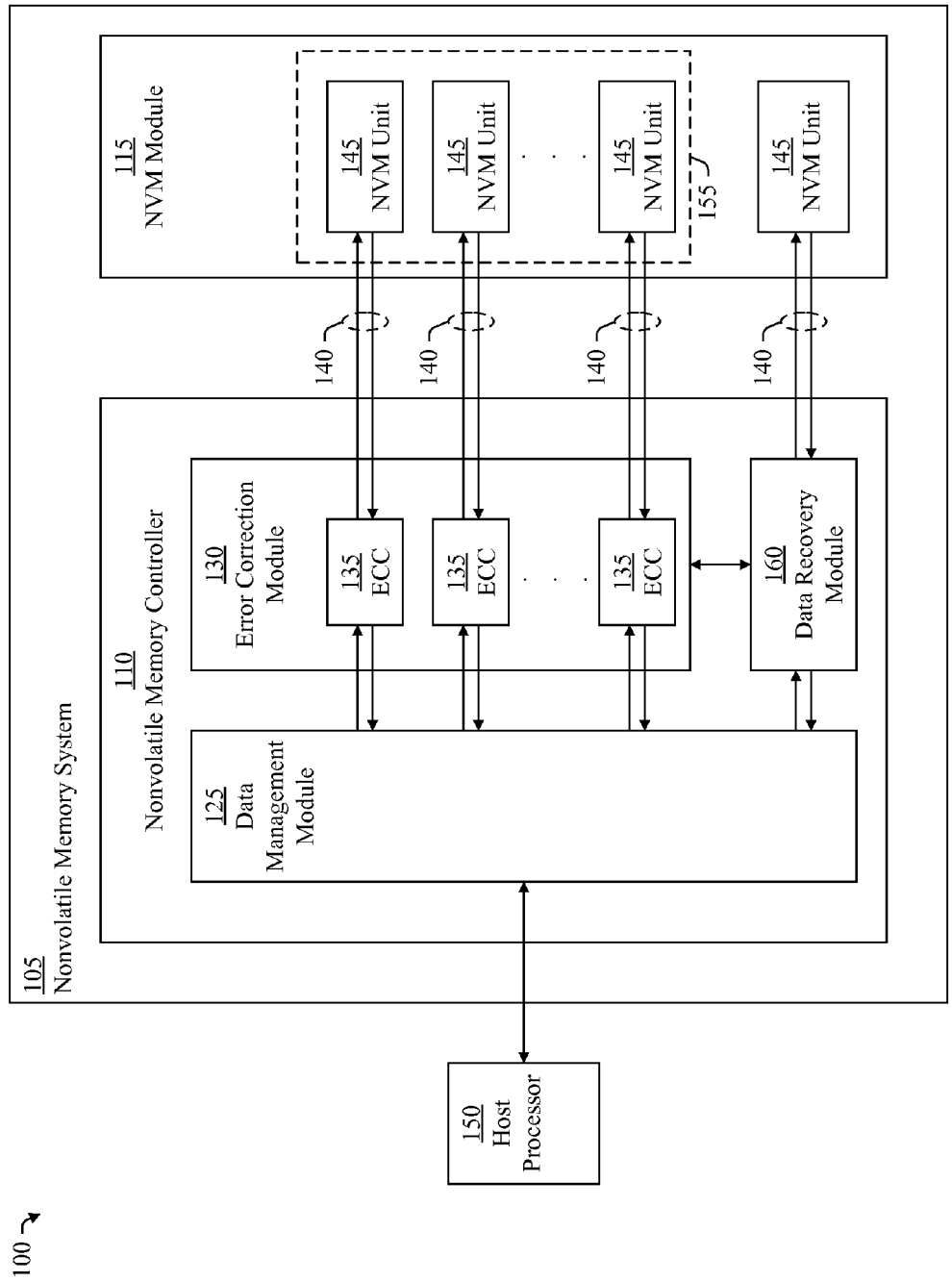
FIG. 1 is a block diagram of computing system, in accordance with an embodiment of the present invention.

FIG. 1 illustrates a computing system 100, in accordance with an embodiment of the present invention. The computing system 100 includes a host processor 150 and a nonvolatile memory system 105 coupled (e.g., connected) to the host processor 150. The nonvolatile memory system 105 includes a nonvolatile memory controller 110 and a nonvolatile memory module (NVM Module) 115 coupled (e.g., connected) to the nonvolatile memory controller 110. In various embodiments, the nonvolatile memory system 105 is a solid state drive (SSD).

The nonvolatile memory controller 110 includes a data management module 125, an error correction module 130, and a data recovery module 160. The data management module 125 is coupled (e.g., connected) to the host processor 150, the error correction module 130, and the data recovery module 160. The error correction module 130 is coupled (e.g., connected) to the nonvolatile memory module 115 and the data recovery module 160. Additionally, the data recovery module 160 is coupled (e.g., connected) to the nonvolatile memory module 115.

In various embodiments, the error correction module 130 includes error correction circuits (ECC) 135, and the nonvolatile memory module 115 includes nonvolatile memory units 145. Moreover, the nonvolatile memory module 115 includes a nonvolatile memory array 155 (i.e., an array of nonvolatile memory units 145), which includes at least some of the nonvolatile memory units 145 in the nonvolatile memory module 115. In some embodiments, each of the error correction circuits 135 is coupled to a corresponding nonvolatile memory unit 145 in the nonvolatile memory array 155 through a corresponding data channel 140. In these embodiments, an error correction circuit 135 corresponding to a nonvolatile memory unit 145 computes error correction codes for data units to be stored in the nonvolatile memory unit 145.

In some embodiments, the error correction module 130 includes a single error correction circuit 135 for computing error correction codes for data units to be stored in any of the nonvolatile memory units 145. In various embodiments, the error correction module 130 may include any number of error corrections circuits 135 and any number of nonvolatile memory units 145. In these embodiments, each of the error corrections circuits 135 computes error correction codes for data units to be stored in one or more nonvolatile memory units 145 associated with the error correction circuit 135. In various embodiments, the data channel 140 is a communication bus.

In various embodiments, the data recovery module 160 is coupled to a corresponding nonvolatile memory unit 145 through a corresponding data channel 140. In some embodiments, the data recovery module 160 is coupled to a corresponding nonvolatile memory unit 145 in the nonvolatile memory array 155. In other embodiments, the data recovery module 160 is coupled to a corresponding nonvolatile memory unit 145 not in the nonvolatile memory array 155. In some embodiments, the data recovery module 160 is coupled to each nonvolatile memory unit 145 in the nonvolatile memory module 115. In further embodiments, the nonvolatile memory array 155 in the nonvolatile memory module 115 includes each of the nonvolatile memory units 145 in the nonvolatile memory module 115. Moreover, the error correction module 130 distributes error correction codes among the nonvolatile memory units 145 in the nonvolatile memory array 155.

In operation, the data management module 125 receives one or more data write commands and data units associated with the data write commands from the host processor 150. The data management module 125 aggregates (e.g., groups) the data units associated with the data write commands into a data stripe. In this way, the data management module 125 generates the data stripe including the data units. Moreover, the data management module 125 generates a data stripe write request based on the data write commands and provides the data stripe write request and the data stripe to the error correction module 130 and to the data recovery module 160.

In response to the data stripe write request, the error correction circuits 135 in the error correction module 130 generate an error correction code for each data unit in the data stripe. The error correction code of data unit includes redundancy information for correcting data bits errors in the data unit, as is described more fully herein. Moreover, each of the error correction circuits 135 has an error correction capacity for correcting up to a predetermined number of data bit errors in a data unit based on the error correction code of the data unit. Each of the error correction circuits 135 generating an error correction code for a data unit of the data stripe writes (i.e., stores) the data unit received from the data management module 125 and the error correction code of the data unit into the nonvolatile memory unit 145 corresponding to the error correction circuit 135. In this way, the error correction module 130 stripes the data units of the data stripe across the nonvolatile memory units 145 of the nonvolatile memory array 155.

Also in response to the data stripe write request, the data recovery module 160 generates a parity unit based on the data units of the data stripe and writes (i.e., stores) the parity unit of the data stripe into the nonvolatile memory module 115 corresponding to the data recovery module 160. The parity unit includes redundancy information for recovering a data unit of the data stripe based on the other data units of the data stripe and the parity unit of the data stripe, as is described more fully herein. For example, the data recovery module 160 may generate the parity unit by performing a logical exclusive-or (XOR) operation on the data units of the data stripe. Further in this example, the data recovery module 160 may recover a data unit of a data stripe by performing a logical exclusive-or operation on the other data units of the data stripe and the parity unit of the data stripe.

In some embodiments, the data recovery module 160 generates a parity unit for a data stripe by performing a logical exclusive-or (XOR) operation on the data units of the data stripe to generate a parity data unit and performing a logical exclusive-or (XOR) operation on the error correction codes of the data units to generate a parity error correction code unit. In these embodiments, the parity unit includes the parity data unit and the parity error correction code unit.

In some embodiments, the data recovery module 160 generates a parity unit for a data stripe by performing a logical exclusive-or (XOR) operation on the data units of the data stripe to generate a parity data unit. Further in these embodiments, the data recovery module 160 generates a parity error correction code based on the parity data unit. For example, the data recovery module 160 may include an error correction circuit 135 for generating the parity error correction code based on the parity data unit. In these embodiments, the parity unit includes the parity data unit and the parity error correction code unit. In other embodiments, the data recovery module 160 provides the parity data unit to an error correction circuit 135 in the error correction module 130, and the error correction circuit 135 generates the parity error correction code of the parity unit based on the parity data unit.

In some embodiments, the data recovery module 160 generates the parity unit by performing a redundant array of inexpensive disks (RAID) algorithm based on a RAID level (e.g., RAID levels 2-6). In these embodiments, the data recovery module 160 recovers a data unit of a data strip by performing a RAID algorithm on the other data units of the data stripe and the parity unit of the data stripe. In various embodiments, the parity unit includes one or more blocks or bits of parity data, which may be stored in a dedicated nonvolatile memory unit 145 of the memory module 115 or distributed among nonvolatile memory units 145 of the memory module 115. For example, the parity unit may be distributed among the nonvolatile memory array 155 according to a RAID Level 5 algorithm.

In addition to receiving the data write commands and the data units from the host processor 150, the data management module 125 receives a data read command from the host processor 150 for reading a data unit from the nonvolatile memory module 115. The data management module 125 identifies the data stripe including the data unit based on the data read command, generates a data stripe read request, and provides the data stripe read request to the error correction module 130 and the data recovery module 160. In response to the data stripe read request, the error correction circuits 135 read the data units of the data stripe and the error correction codes of the data units from the nonvolatile memory module 115. For example, each error correction circuit 135 receiving the data stripe read request may read a data unit of the data stripe from the nonvolatile memory unit 145 corresponding to the error correction circuit 135. Also in response to the data stripe read request, the data recovery module 160 reads the parity unit of the data stripe from one or more nonvolatile memory units 145. For example, the data recovery module 160 may read the parity unit from the nonvolatile memory unit 145 corresponding to the data recovery module 160. As another example, the parity unit may be distributed among a number of nonvolatile memory units 145, and the data recovery module 160 may read the parity unit by reading a portion of the parity unit from each of those nonvolatile memory units 145.

Additionally, each error correction circuit 135 reading a data unit and the error correction code of the data unit from a nonvolatile memory unit 145 determines whether the data unit has any data bit errors based on the error correction code of the data unit. If the data unit has at least one data bit error, the error correction circuit 135 determines whether the number of data bit errors in the data unit exceeds the error correction capacity of the error correction circuit 135. If the number of data bit errors in the data unit does not exceed the error correction capacity of the error correction circuit 135, the error correction circuit 135 corrects each data bit error in the data unit based on the error correction code of the data unit.

Further, each error correction circuit 135 reading a data unit and the error correction code of the data unit determines whether the data unit has a number of data bit errors exceeding the error correction capacity of the error correction circuit 135. If none of the data units of the data stripe has a number of data bits errors exceeding the error correction capacity of the error correction module, the error correction circuit 135 provides the data units (e.g., corrected data units) of the data stripe to the data management module 125. In turn, the data management module 125 provides the data units of the data stripe to the host processor 150.

Otherwise, if one of the error correction circuits 135 determines a data unit of the data stripe includes a number of data bit errors exceeding the error correction capacity of the error correction module 130, the error correction module 130 provides the other data units (e.g., corrected data units) of the data stripe to the data recovery module 160. In turn, the data recovery module 160 recovers the data unit based on the other data units of the data stripe and the parity unit of the data stripe and provides the recovered data unit to the error correction module 130. The error correction module 130 provides the recovered data unit and the other data units (e.g., corrected data units) of the data stripe to the data management module 125. In this way, the error correction module 130 provides the data stripe to the data management module 125. In turn, the data management module 125 provides the data stripe to the host processor 150. In other embodiments, the data recovery module 160 provides the recovered data unit directly to the data management module 125, and the error correction module 130 provides the other data units of the data stripe to the data management module 125.

In various embodiments, each of the data management module 125, the error correction module 130, and the data recovery module 160 may include one or more hardware components, one or more software components, or some combination thereof. Examples of hardware components include a combinational logic circuit, a sequential logic circuit, a microprocessor, an embedded processor, an embedded controller, or the like. Examples of software components include a computing program, computing instructions, a software routine, or the like. In some embodiments, the error correction circuits 135 are implemented in hardware component and the data recovery module 160 executes a software component to recover a data unit of a data stripe.

Because the nonvolatile memory controller 110 has a first stage including the error correction module 130 for correcting data bit errors up to an error correction capacity and a second stage including the data recovery module 160 for recovering data units having data bit errors exceeding the error correction capacity, the nonvolatile memory controller 110 has a higher reliability than other nonvolatile memory controllers not capable of performing both error correction and data recovery on a data stripe. In some embodiments, the nonvolatile memory controller 110 is a flash memory controller and the nonvolatile memory module 115 is a flash storage system. For example, each of the nonvolatile memory units 145 may be a flash storage device or include a number of flash storage devices.

In some embodiments, the data recovery module 160 receives the error correction codes of the data units in the data stripe from the error correction module 130 and generates the parity unit of the data stripe based on the data units of the data stripe and the error correction codes of the data units. In this embodiment, the data recovery module 160 recovers the error correction code of a data unit in a data stripe when recovering the data unit. Further, the data recovery module 160 provides the error correction codes of the data units in the data stripe to the host processor 150. In various embodiments, the error correction module 130 may have any number of error correction circuits 135 and the nonvolatile memory controller 110 may have any number of nonvolatile memory units 145.

In various embodiments, the nonvolatile memory controller 110 is implemented in an integrated circuit of an integrated circuit device, which may include an integrated circuit package containing the integrated circuit. In some embodiments, the nonvolatile memory controller 110 is implemented in a single integrated circuit die. In other embodiments, the nonvolatile memory controller 110 is implemented in more than one integrated circuit die of an integrated circuit device which may include a multichip package containing the integrated circuit die.

In various embodiments, the nonvolatile memory system 105 is implemented in an integrated circuit of an integrated circuit device, which may include an integrated circuit package containing the integrated circuit. In some embodiments, the nonvolatile memory system 105 is implemented in a single integrated circuit die. In other embodiments, the nonvolatile memory system 105 is implemented in more than one integrated circuit die of an integrated circuit device which may include a multichip package containing the integrated circuit die.

Figure 2:
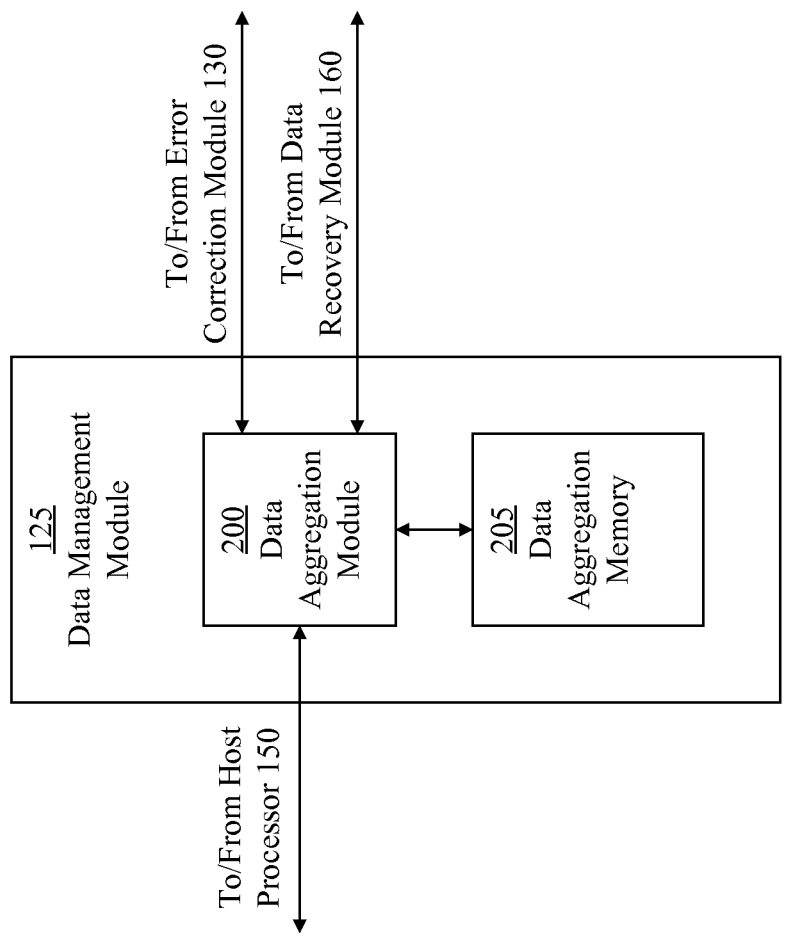
FIG. 2 is a block diagram of a data management module, in accordance with an embodiment of the present invention.

FIG. 2 illustrates the data management module 125, in accordance with an embodiment of the present invention. The data management module 125 includes a data aggregation module 200 and a data aggregation memory 205 coupled (e.g., connected) to the data aggregation module 200. The data aggregation module 200 receives data write commands and data units associated with the data write commands from the host processor 150 and writes (i.e., stores) the data units into the data aggregation memory 205. Further, the data aggregation module 200 selects data units stored in the data aggregation memory 205, generates a data stripe including the selected data units, and provides the data stripe to the error correction module 130 and the data recovery module 160.

In addition to receiving data write commands from the host processor 150, the data aggregation module 200 receives a data read command from the host processor 150. The data read command includes an address of a data unit (i.e., a data unit address) in a data stripe previously generated by the data aggregation module 200. Moreover, the data aggregation module 200 identifies the data stripe based on the address of the data unit. In this way, the data aggregation module 200 identifies the other data units and the parity unit of the data stripe. Furthermore, the data aggregation module 200 generates a data stripe read request for reading the data stripe from the nonvolatile memory module 115 based on identifiers of the data units and the parity unit in the data stripe.

In some embodiments, the data management module 125 selects a size of the data stripe by selecting the number of data units to be included in the data stripe. In this way, the nonvolatile memory controller 110 is programmable to select a size of the data stripe by selecting the number of data units in the data stripe. For example, the data management module 125 may select the size of the data stripe based on user input to the nonvolatile memory controller 110. Further, the data management module 125 selects the error correction circuits 135 in the error correction module 130 for processing the data stripe. For example, the data management module 125 may select the size of the data stripe such that each of the selected error correction circuits 135 processes a data unit of the data stripe. As another example, the data management module 125 may select a single error correction circuit 135 in the error correction module 130 for processing the data units of the data stripe.

In various embodiments, the error correction module 130 is capable of correcting up to a maximum number of data bit errors in a data unit. In these embodiments, the error correction capacity of the error correction module 130 is equal to the maximum number of data bit errors correctable in a data unit by the error correction module 130. In other embodiments, the error correction module 130 is programmable to select an error correction capacity of the error correction module 130 for correcting up to the maximum number of data bit errors correctable in a data unit by the error correction module 130. In these embodiments, the selected error correction capacity may be less than the maximum number of data bit errors correctable in a data unit by the error correction module 130.

FIG. 3 illustrates a data stripe descriptor 300, in accordance with an embodiment of the present invention. The data stripe descriptor 300 identifies the data units and the parity unit of a data stripe. As illustrated in FIG. 3, the data stripe descriptor 300 includes a data unit address 305 for each data unit in the data stripe as well as a parity unit address 310 for the parity unit of the data stripe. Each of the data unit addresses 305 (e.g., data unit address 305a-c) identifies a data unit of the stripe, and the parity unit address 310 identifies the parity unit of the data stripe. In this way, the data stripe descriptor 300 identifies the data stripe. In various embodiments, the data management module 125 generates a data stripe by generating the data stripe descriptor 300 of the data stripe. Moreover, the data management module 125 aggregates the data units of the data stripe by generating the data stripe descriptor 300 of the data stripe.

FIG. 4 illustrates a data stripe lookup table 400, in accordance with an embodiment of the present invention. The data stripe lookup table 400 includes table entries 405, each of which includes a data unit address 305 of a data unit in a data stripe or includes a parity unit address 310 of a parity unit in a data stripe. Additionally, the each of the table entries 405 in the data stripe lookup table 400 includes a descriptor pointer 410 identifying the data stripe descriptor 300 including the data unit address 305 or the parity unit address 310 in the table entry 405. In this way, the data unit address 305 or the parity unit address 310 in the table entry 405 is associated with the descriptor pointer 410 in the table entry 405.

In various embodiments, the data management module 125 receives a data read command including a data unit address 305 and identifies the data stripe descriptor 300 including the data unit address 305 based on the descriptor pointer 410 associated with the data unit address 305 in a table entry 405 of the data stripe lookup table 400. In this way, the data management module 125 identifies the data units and the parity unit of the data stripe based on the data stripe descriptor 300 of the data stripe. Moreover, the data management module 125 generates a data stripe read request for the data stripe identified by the data stripe descriptor 300. For example, the data management module 125 may identify the data unit addresses 305 and the parity unit address 310 for the data stripe based on the data stripe descriptor 300 and generate a data stripe read request including the data unit addresses 305 and the parity unit address 310. As another example, the data management module 125 may generate a data stripe read request by generating data read requests for the respective data units and a data read request for the parity unit. In this example, the data management module 125 provide each data read request for a data unit to a corresponding error correction circuit 135 and provides the data read request for the parity unit to the data recovery module 160. In some embodiments, the data management module 125 provides data requests, such as data read requests and data write requests, directly to the nonvolatile memory units 145 in the nonvolatile memory module 115.

Figure 5:
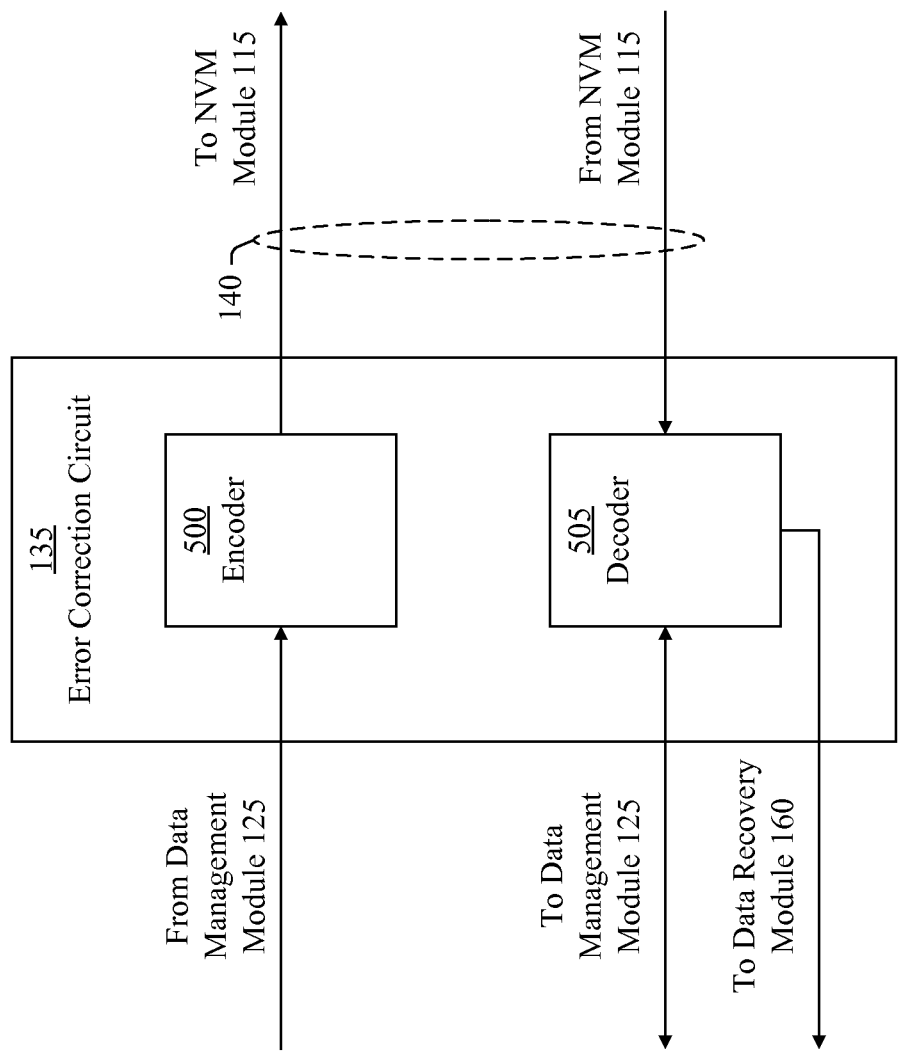
FIG. 5 is a block diagram of an error correction circuit, in accordance with an embodiment of the present invention.

FIG. 5 illustrates an error correction circuit 135, in accordance with an embodiment of the present invention. The error correction circuit 135 includes an encoder 500 and a decoder 505. The encoder 500 is coupled (e.g., connected) to the data management module 125 and the nonvolatile memory module 115. The decoder 505 is coupled (e.g., connected) to the data management module 125, the data recovery module 160, and the nonvolatile memory module 115.

The encoder 500 receives a data write request including a data unit and a data unit address 305 from the data management module 125, and generates an error correction code based on the data unit. The encoder 500 writes (i.e., stores) the data unit and the error correction code of the data unit into a storage location in a nonvolatile memory unit 145 identified by the data unit address 305. For example, the storage location in the nonvolatile memory unit 145 may be a page frame.

In some embodiments, the decoder 505 receives a data read request (e.g., a data stripe read request) including a data unit address 305 from the data management module 125 and reads a data unit and the error correction code of the data unit from a nonvolatile memory unit 145 based on the data unit address 305. In other embodiments, a nonvolatile memory unit 145 receives a data request including a data unit address 305 from the data management module 125 and provides the data unit and the error correction code of the data unit contained at the data unit address 305 of the nonvolatile memory unit 145 to a decoder 505. In various embodiments, the decoder 505 detects data bit errors in the data unit and corrects any data bit errors in the data unit up to the error correction capacity of the error correction circuit 135. Details for other embodiments of the decoder 505 are described in U.S. patent application Ser. No. 12/913, filed on Oct. 27, 2010 and entitled "BCH Data Correction System and Method," which is incorporated herein by reference in its entirety.

Figure 6:
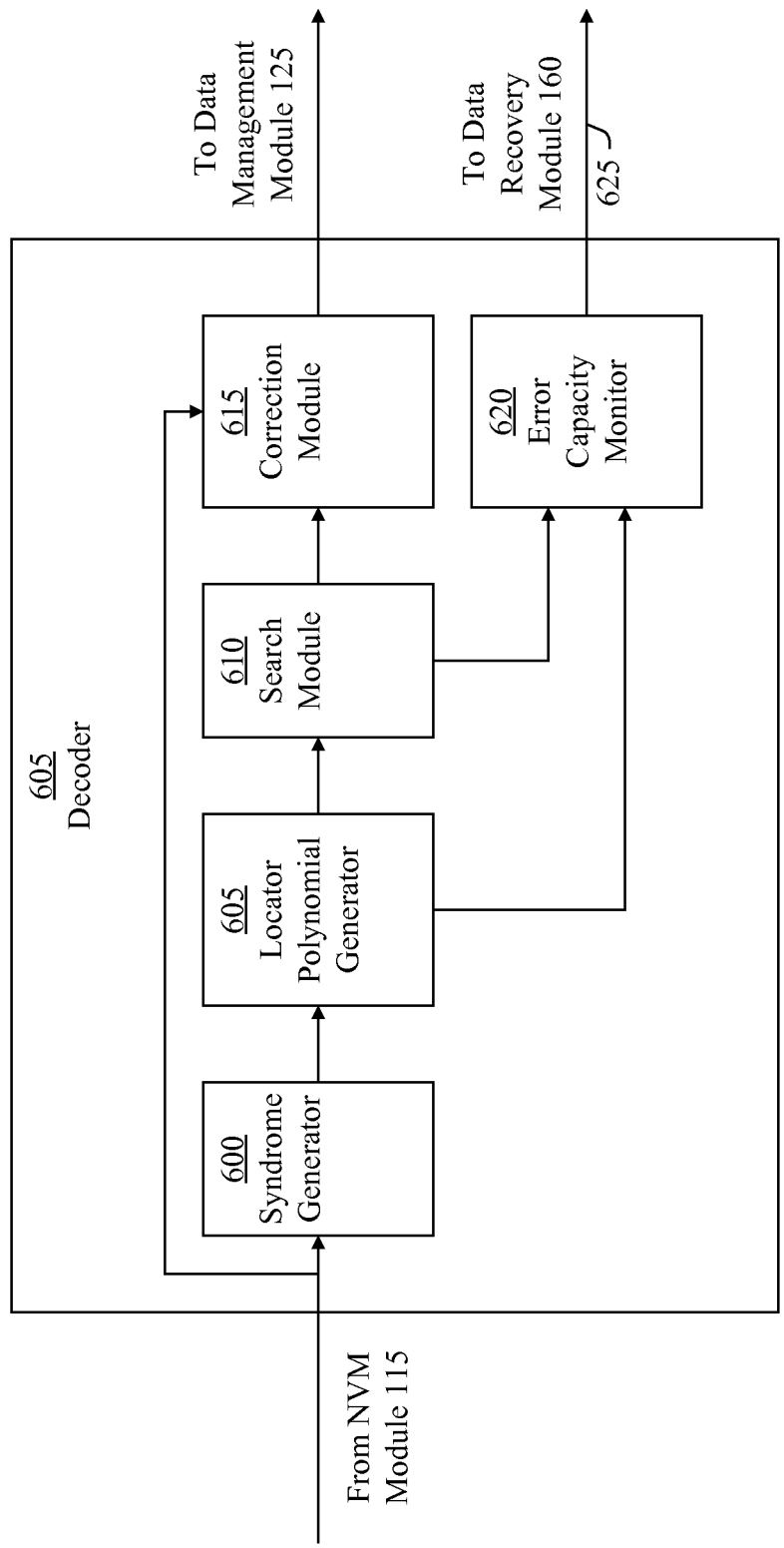
FIG. 6 is a block diagram of a decoder, in accordance with an embodiment of the present invention.

FIG. 6 illustrates the decoder 505, in accordance with an embodiment of the present invention. In this embodiment, the decoder 505 is a BCH decoder. The decoder 505 includes a syndrome generator 600, a locator polynomial generator 605, a search module 610, a correction module 615, and an error capacity monitor 620. The decoder 505 is coupled (e.g., connected) to the nonvolatile memory unit 145 corresponding to the error correction circuit 135 including the decoder 505. The locator polynomial generator 605 is coupled (e.g., connected) to the syndrome generator 600, the search module 610, and the error capacity monitor 620. Additionally, the search module 610 is coupled (e.g., connected) to the correction module 615 and the error capacity monitor 620. The correction module 615 is coupled to the data management module 125. The error capacity monitor 620 is coupled (e.g., connected) to the data recovery module 160.

The syndrome generator 600 receives a data unit and the error correction code of the data unit from a nonvolatile memory unit 145 and generates a syndrome based on the data unit and the error correction code of the data unit. The locator polynomial generator 605 generates a locator polynomial based on the syndrome generated by the syndrome generator 600. The locator polynomial has a degree indicating a number of roots of the locator polynomial. Moreover, the degree of the locator polynomial indicates a number of data bit error in the data unit. The locator polynomial generator 605 is capable of generating a locator polynomial having a degree up to a maximum degree. In this way, the maximum degree of a locator polynomial generated by the locator polynomial generator 605 defines an error correction capacity of the decoder 505 (i.e., a maximum number of data bit errors correctable by the decoder 505).

The search module 610 generates an error indicator based on the locator polynomial by finding the roots of the locator polynomial generated by the locator polynomial generator 605. The error indicator indicates a number of data bit errors in the data unit and identifies the bit position of each data bit error in the data unit. The correction module 615 corrects the data bit errors indicated by the error indicator in the data unit.

In some cases, the number of data bit errors in the data unit as indicated by the degree of a locator polynomial is the same as the number of data bit errors as indicated by the error indicator generated based on the locator polynomial. In these cases, the correction module 615 corrects each of the data bit errors in the data unit based on the error indicator generated by the search module 610.

In some cases, the number of data bit errors in the data unit exceeds the error correction capacity of the decoder 505 (i.e., the number of data bit errors exceeds the maximum degree of a locator polynomial generated by the locator polynomial generator 605). In these cases, the locator polynomial indicates a number of data bit errors in the data unit equal to or less than the maximum degree of the locator polynomial but the error indicator indicates a number of data bit errors less than the degree of the locator polynomial. Moreover, if the number of data bit errors indicated by the degree of the locator polynomial is not equal to the number of data bit errors indicated by the error indicator, the error capacity monitor 620 generates a error capacity indicator 625 indicating the number of data bit errors in the data unit exceeds an error correction capacity of the decoder 505. The error capacity monitor 620 provides the error capacity indicator 625 to the data recovery module 160. In response to the error recovery indicator, the data recovery module 160 recovers the data unit based on the other data units of the data stripe and the parity unit of the data stripe, as is discussed more fully herein.

In various embodiments, the decoder 505 is a BCH decoder having a very high error correction capacity. For example, the BCH decoder may have an uncorrected bit error rate (UBER) of $1 \times 10^{-9}$ for a raw bit error rate (BER) of $1 \times 10^{-3}$ in the data units stored in the nonvolatile memory module 115. As another example, the BCH decoder may have an uncorrected bit error rate (UBER) of $1 \times 10^{-12}$ for a raw bit error rate (BER) of $1 \times 10^{-3}$ in the data units stored in the nonvolatile memory module 115. In some embodiments, the BCH decoder has an uncorrected bit error rate (UBER) in the range of $1 \times 10^{-9}$ to $1 \times 10^{-15}$ for a raw bit error rate (BER) of $1 \times 10^{-3}$ in the data units stored in the nonvolatile memory module 115.

Figure 7:
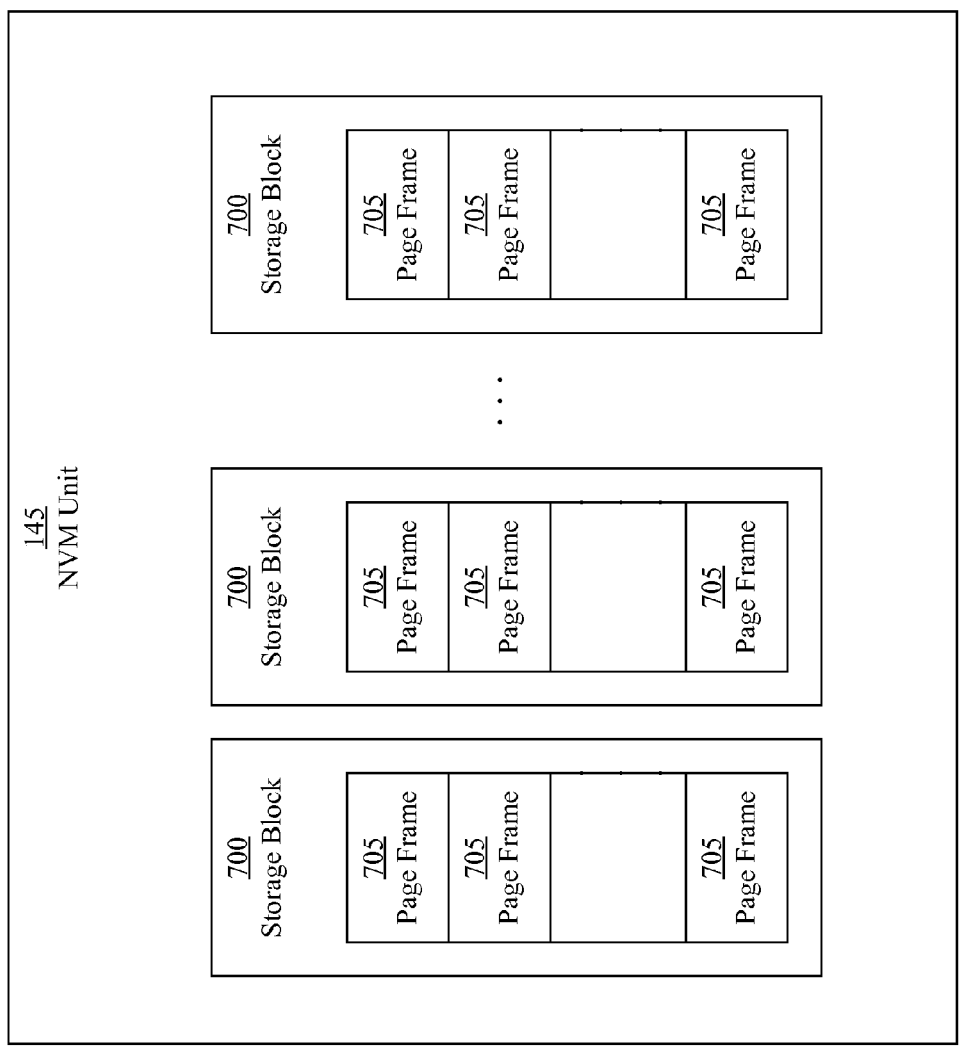
FIG. 7 is a block diagram of a nonvolatile memory unit, in accordance with an embodiment of the present invention.

FIG. 7 illustrates the nonvolatile memory unit 145, in accordance with an embodiment of the present invention. The nonvolatile memory unit 145 includes storage blocks 700. Each of the storage blocks 700 includes a number of page frames 705. Moreover, each of the page frames 705 has a storage capacity for storing a memory page. In various embodiments, the error correction module 130 stores a memory page including a data unit of a data stripe and the error correction code of the data unit into a page frame 705 of a nonvolatile memory unit 145. Further, the error correction module 130 stores a memory page including a parity unit of a data stripe and the error correction code of the parity unit into a page frame 705 of a nonvolatile memory unit 145.

Figure 8:
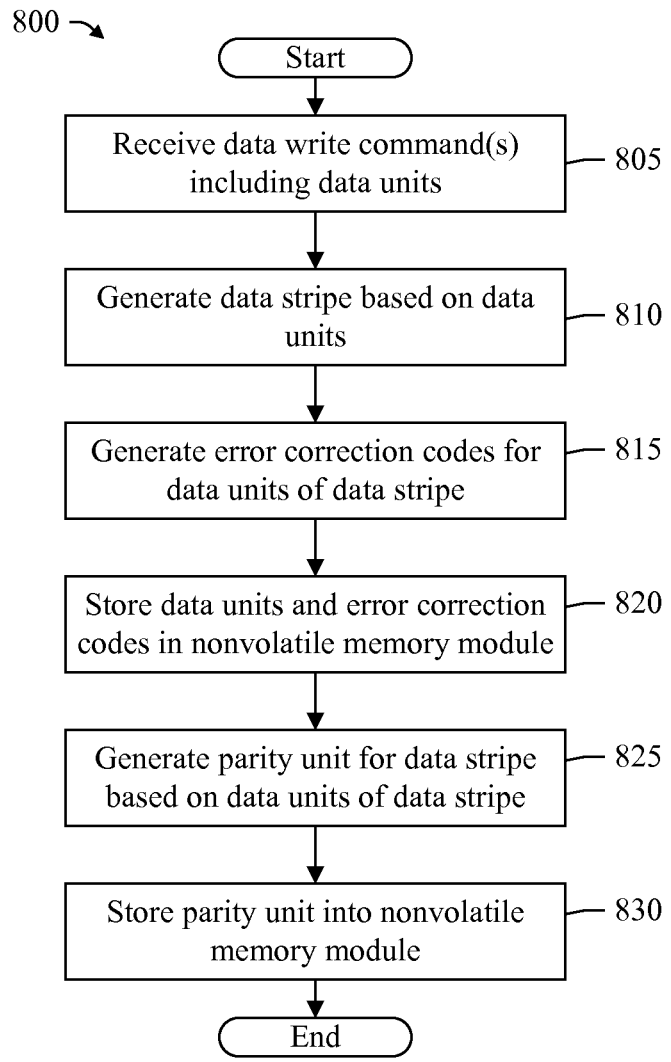
FIG. 8 is a flow chart for a method of managing data in a nonvolatile memory controller, in accordance with an embodiment of the present invention.

FIG. 8 illustrates a method 800 of managing data in a nonvolatile memory controller, in accordance with an embodiment of the present invention. In step 805, one or more data write commands including data units are received. In various embodiments, the nonvolatile memory controller 110 receives one or more data write commands including data units from the host processor 150. For example, the data management module 125 of the nonvolatile memory controller 110 may receive the data write commands and the data units. Further in this example, the data aggregation module 200 of the data management module 125 stores the data units in the data aggregation memory 205 of the data management module 125. The method 800 then proceeds to step 810.

In step 810, a data stripe is generated based on the data units. In various embodiments, the nonvolatile memory controller 110 generates a data stripe based on the data units. For example, the data management module 125 may generate a data stripe based on the data units by aggregating the data units into the data stripe. In some embodiments, the data management module 125 generates a data stripe by generating a data stripe descriptor 300 for the data stripe, which identifies the data units and the parity unit of the data stripe. Further, the data management module 125 generates a table entry 405 in a data stripe lookup table 400 for each data unit of the data stripe. The method 800 then proceeds to step 815.

In step 815, error correction codes are generated for the data units of the data stripe. In various embodiments, the nonvolatile memory controller 110 generates an error correction code for each data unit of the data stripe based on the data unit. For example, the error correction module 130 may generate the error correction codes. The method 800 then proceeds to step 820.

In step 820, the data units and the error correction codes are stored in a nonvolatile memory module. In various embodiments, the nonvolatile memory controller 110 stores the data units and the error correction codes into the nonvolatile memory module 115. For example, the error correction circuits 135 of the correction module 130 may store the data units and the error correction codes into the nonvolatile memory units 145 of the nonvolatile memory module 115. The method 800 then proceeds to step 825.

In step 825, a parity unit is generated for the data stripe based on the data units of the data stripe. In various embodiments, the nonvolatile memory controller 110 generates a parity unit based on the data units of the data stripe. For example, the data recovery module 160 may generate the parity unit based on the data units of the data stripe. In some embodiments, the data management module 125 generates a table entry 405 in a data stripe lookup table 400 for the parity unit of the data stripe.

In some embodiments, the data recovery module 160 generates the parity unit by performing a logical exclusive-or (XOR) operation on the data units of a data stripe. In other embodiments, the data recovery module 160 generates the parity unit by performing a logical exclusive-or (XOR) operation on the data units of the data stripe and the error correction codes of the data units to generate a parity unit including a parity data unit and a parity error correction code unit. In some embodiments, the data recovery module 160 generates the parity unit by performing a logical exclusive-or (XOR) operation on the data units of a data stripe to generate a parity data unit and generates a parity error correction code unit of the parity unit based on the parity data unit of the parity unit. In some embodiments, the data recovery module 160 generates the parity unit by performing a logical exclusive-or (XOR) operation on the data units of a data stripe to generate a parity data unit and the error correction module 130 generates a parity error correction code unit of the parity unit based on the parity data unit of the parity unit. The method 800 then proceeds to step 830.

In step 830, the parity unit is stored into the nonvolatile memory module. In various embodiments, the nonvolatile memory controller 110 stores the parity unit into the nonvolatile memory module 115. For example, the data recovery module 160 may store the parity unit into a nonvolatile memory unit 145 of the nonvolatile memory module 115. In some embodiments, the data recovery module 160 also stores an error correction code of the parity unit in the nonvolatile memory unit 145. The method 800 then ends.

In various embodiments, the method 800 illustrated in FIG. 8 may include more or fewer than the steps 805-830 illustrated in FIG. 8 and described above. In some embodiments, the steps 805-830 of the method 800 illustrated in FIG. 8 may be performed in a different order than the order illustrated in FIG. 8 and described above. In some embodiments, some of the steps 805-830 of the method 800 illustrated in FIG. 8 may be performed in parallel or substantially simultaneously. In various embodiments, one or more of the steps 805-830 may be performed more than once in the method 800 illustrated in FIG. 8.

Figure 9:
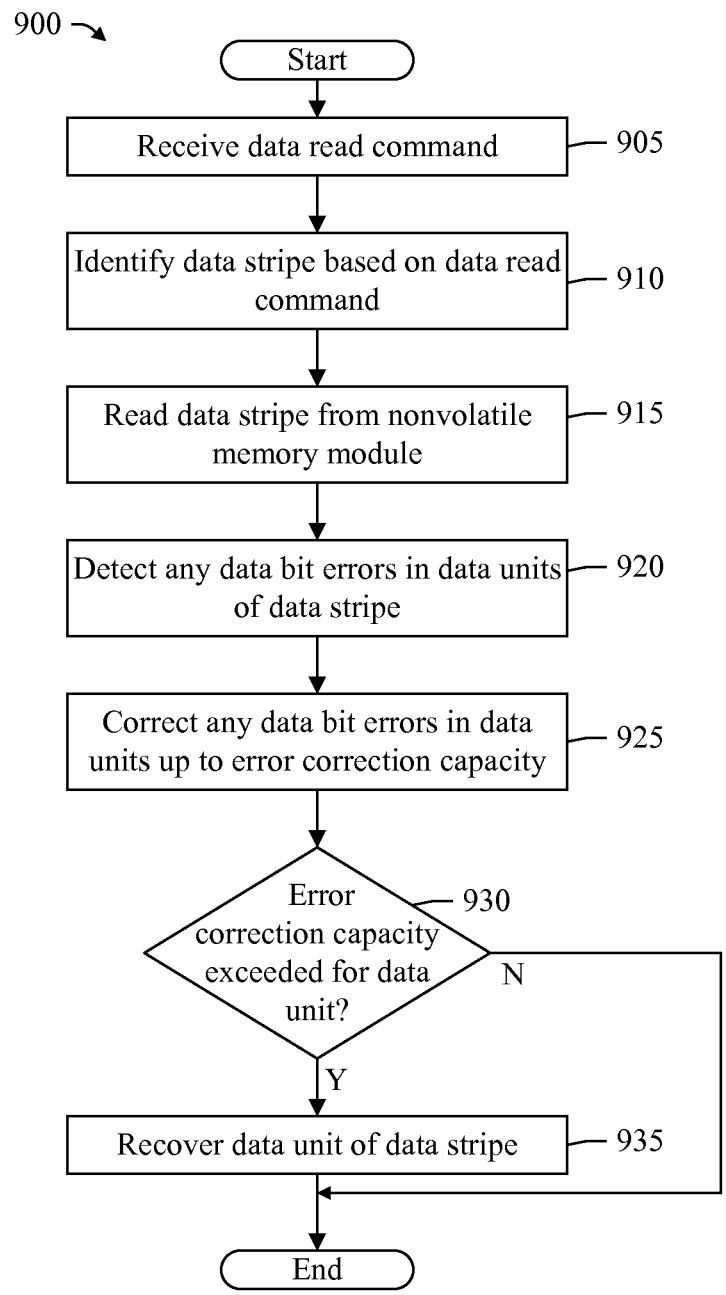
FIG. 9 is a flow chart for a method of managing data in a nonvolatile memory controller, in accordance with an embodiment of the present invention.

FIG. 9 illustrates a method 900 of managing data in a nonvolatile memory controller, in accordance with an embodiment of the present invention. In some embodiments, the method 900 illustrated in FIG. 9 is a portion of the method 800 illustrated in FIG. 8. For example, the method 900 illustrated in FIG. 9 may follow step 830 of the method 800 illustrated in FIG. 8.

In step 905, a data read command is received. In various embodiments, the nonvolatile memory controller 110 receives a data read command including a data unit address 305 of a data unit. For example, the data management module 125 may receive the data read command including the data unit address 305. The method 900 then proceeds to step 910.

In step 910, a data stripe is identified based on the data read command. In various embodiments, the nonvolatile memory controller 110 identifies the data stripe based on the data unit address 305 of the data unit in the data read command. For example, the data management module 125 may identify the data stripe by identifying the data stripe descriptor 300 of the data stripe in the data stripe lookup table 400 based on the data unit address 305. The method 900 then proceeds to step 915.

In step 915, the data stripe is read from the nonvolatile memory module. In various embodiments, the nonvolatile memory controller 110 reads the data stripe from the nonvolatile memory module 115. For example, the error correction circuits 135 of the error correction module 130 may generate a data read request for each of the data units and provide each data read request to an error correction unit 135 in the error correction module 130. In turn, each error correction unit 135 receiving a data read request reads a data unit of the data stripe and the error correction code of the data unit from a nonvolatile memory unit 145 corresponding to the error correction circuit 135. The method 900 then proceeds to step 920.

In step 920, any data bit errors are detected in the data units of the data stripe. In various embodiments, the nonvolatile memory controller 110 detects any data bit errors in each data unit of the data stripe. For example, the error correction circuits 135 of the error correction module 130 may detect data bits errors in each data unit based on the error correction code of the data unit. The method 900 then proceeds to step 925.

In step 925, any data bit errors in the data units of the data stripe up to an error correction capacity are corrected. In various embodiments, the nonvolatile memory controller 110 corrects any data bit errors in the data units of the data stripe up to an error correction capacity of the error correction module 130. For example, each of the error correction circuits 135 of the error correction module 130 may correct a number of data bits errors in a data unit of the data stripe up to the error correction capacity of the error correction circuit 135 based on the error correction code of the data unit. The method 900 then proceeds to step 930.

In step 930, it is determined whether a data unit of the data stripe has a number of data bit errors exceeding an error correction capacity of the error correction module. In various embodiments, the nonvolatile memory controller 110 determines whether a data unit of the data stripe has a number of data bit errors exceeding an error correction capacity of the error correction module 130. For example, an error correction circuit 135 of the error correction module 130 may determine whether the data unit exceeds the error correction capacity of the error correction unit 135.

In one embodiment, the error capacity monitor 620 of an error correction circuit 135 in the error correction module 130 generates an error capacity indicator 625 indicating whether a data unit of the data stripe has a number of data bit errors exceeding the error correction capacity of the error correction module 130. In this embodiment, the error capacity monitor 620 compares the degree of the locator polynomial generated by the locator polynomial generator 605 in the error correction circuit 135 to the number of error bits indicated by the error indicator generated by the search module 610 in the error correction circuit 135. If degree of the locator polynomial is not equal to the number of error bits indicated by the error indicator, the error capacity module 620 generates the error capacity indicator 625 indicating that the data unit exceeds the error correction capacity of the error correction circuit 135. If a data unit of the data stripe has a number of data bit errors exceeding the error correction capacity of the error correction module 130, the method 900 proceeds to step 935. Otherwise, the method 900 ends.

In step 935, the data unit having the number of data bit errors exceeding the error correction capacity of the error correction module is recovered. In various embodiments, the nonvolatile memory controller 110 recovers the data unit having the number of data bit errors exceeding the error correction capacity of the error correction module 130. For example, the data recovery module 160 may recover the data unit based on the other data units of the data stripe containing the data unit and the parity unit of the data stripe.

In various embodiments, the data recovery module 160 performs one or more logical operations on the other data units of the data stripe and the parity unit of the data stripe to recover the data unit of the data stripe having the number of data bit errors exceeding the error correction capacity of the error correction module 130. In some embodiments, the data recovery module 160 performs an exclusive-or (XOR) operation on the other data units of the data stripe and the parity unit of the data stripe to recover the data unit. For example, the data recovery module 160 may recover the data unit by performing a RAID algorithm on the other data units of the data stripe and the parity unit of the data stripe. Further in this example, the RAID algorithm may be based on a standard RAID level (e.g., a RAID level 3-6) known in the relevant art.

In some embodiments, the data recovery module 160 recovers an error correction code of the recovered data unit in addition to recovering data unit. In these embodiments, the data recovery module 160 generates the error correction code of the recovered data unit by performing a logical exclusive-or (XOR) operation on the error correction codes of the other data units of the data stripe and the error correction code of the parity unit of the data stripe. In some embodiments, an error correction circuit 135 of the error correction module 130 generates the error correction code of the recovered data unit by performing a logical exclusive-or (XOR) operation on the error correction codes of the other data units of the data stripe and the error correction code of the parity unit of the data stripe. The method 900 then ends.

In various embodiments, the method 900 illustrated in FIG. 9 may include more or fewer than the steps 905-935 illustrated in FIG. 9 and described above. In some embodiments, the steps 905-935 of the method 900 illustrated in FIG. 9 may be performed in a different order than the order illustrated in FIG. 9 and described above. In some embodiments, some of the steps 905-935 of the method 900 illustrated in FIG. 9 may be performed in parallel or substantially simultaneously. In various embodiments, one or more of the steps 905-935 may be performed more than once in the method 900 illustrated in FIG. 9.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. A nonvolatile memory system comprising:
an error correction module configured to receive a data stripe including data units and to generate an error correction code for each data unit of the data stripe for correcting data bit errors in the data unit;
a data recovery module configured to generate a parity unit for the data stripe based on the data units of the data stripe for recovering a data unit of the data stripe based on other data units of the data stripe and the parity unit;
a nonvolatile memory module coupled to the error correction module and the data recovery module, the nonvolatile memory module configured to store the data stripe, the parity unit, and the error correction codes;
the error correction module further configured to read the data stripe and the error correction codes from the nonvolatile memory module in response to a data stripe read request, to correct data bit errors in a data unit of the data stripe if the data unit has a number of data bit errors not exceeding an error correction capacity of the error correction module to generate corrected data units and to provide the corrected data units of the data stripe to the data recovery module if the number of data bit errors of the data unit exceeds the error correction capacity of the error correction module; and
the data recovery module further configured to read the parity unit from the nonvolatile memory module in response to a data stripe read request and to recover the data unit of the data stripe based on the corrected data units of the data stripe and the parity unit if the data unit has a number of data bit errors exceeding the error correction capacity of the error correction module.

2. The nonvolatile memory system of claim 1, wherein the data recovery module is further configured to recover the error correction code of a data unit of the data stripe when recovering a data unit based on the corrected data units of the data stripe and the parity unit if the data unit has a number of data bit errors exceeding the error correction capacity of the error correction module.

3. The nonvolatile memory system of claim 1, wherein the error correction module comprises a plurality of error correction circuits, each error correction circuit of the plurality of error correction circuits configured to generate an error correction code of a data unit in the data stripe.

4. The nonvolatile memory system of claim 1, wherein the error correction module includes a BCH error correction circuit having an error correction capacity for correcting up to the predetermined number of data bit errors, the BCH error correction circuit further configured to generate an error capacity indicator for indicating whether the error correction capacity of the BCH error correction circuit is exceeded for a data unit.

5. The nonvolatile memory system of claim 4, wherein the BCH error correction circuit is configured to generate a locator polynomial based on a data unit, identify a number of data bit errors in the data unit based on the locator polynomial, and determine the identified number of data bit errors in the data unit exceeds the error correction capacity of the BCH error correction circuit by determining the identified number of data bit errors in the data unit is not equal to the degree of the locator polynomial.

6. The nonvolatile memory system of claim 1, wherein the nonvolatile memory module comprises an array of nonvolatile memory units configured to store the data stripe, and the error correction module is further configured to stripe the data units of the data stripe across the array of nonvolatile memory units.

7. The nonvolatile memory system of claim 1, wherein the nonvolatile memory module is further configured to store a memory page including a data unit of the data stripe and the error correction code of the data unit into a page frame of the nonvolatile memory module.

8. The nonvolatile memory system of claim 1, further comprising a data management module configured to receive a plurality of data units and to generate the data stripe by aggregating a number of data units of the plurality of data units into the data stripe.

9. The nonvolatile memory system of claim 8, wherein the data management module is programmable to select a size of the data stripe by selecting the number of data units in the data stripe.

10. A nonvolatile memory system comprising:
a data management module configured to receive a plurality of data units and to generate a data stripe by aggregating a number of data units of the plurality of data units into the data stripe;
an error correction module comprising a plurality of error correction circuits, each error correction circuit of the plurality of error correction circuits configured to generate an error correction code for a data unit of the data stripe for correcting data bit errors in the data unit;
a data recovery module configured to generate a parity unit for the data stripe based on the data units of the data stripe for recovering a data unit of the data stripe based on other data units of the data stripe and the parity unit;
a nonvolatile memory module coupled to the error correction module and the data recovery module, the nonvolatile memory module comprising a plurality of nonvolatile memory units configured to store the data stripe, the parity unit, and the error corrections codes;
each error correction circuit of the plurality of error correction circuits further configured to read the data stripe and the error correction codes from the nonvolatile memory module in response to a data stripe read request, to correct data bit errors in a data unit of the data stripe if the data unit has a number of data bit errors not exceeding an error correction capacity of the error correction module to generate corrected data units and to provide the corrected data units of the data stripe to the data recovery module if the number of data bit errors of the data unit exceeds the error correction capacity of the error correction module; and
the data recovery module further configured to read the parity unit from the nonvolatile memory module in response to a data stripe read request and to recover the data unit of the data stripe based on the corrected data units of the data stripe and the parity unit if the data unit has a number of data bit errors exceeding the error correction capacity of the error correction module.

11. The nonvolatile memory system of claim 10, wherein the data recovery module is further configured to recover the error correction code of a data unit of the data stripe when recovering a data unit based on the corrected data units of the data stripe and the parity unit if the data unit has a number of data bit errors exceeding the error correction capacity of the error correction module.

12. The nonvolatile memory system of claim 10, wherein the plurality of nonvolatile memory units comprises an array of nonvolatile memory units configured to store the data stripe, and the error correction module is further configured to stripe the data units of the data stripe across the array of nonvolatile memory units.

13. The nonvolatile memory system of claim 10, wherein an error correction circuit of the error correction module is a BCH error correction circuit having an error correction capacity for correcting up to the predetermined number of data bit errors, the BCH error correction circuit further configured to generate an error capacity indicator for indicating whether the error correction capacity of the BCH error correction circuit is exceeded for a data unit.

14. The nonvolatile memory system of claim 13, wherein the BCH error correction circuit is configured to generate a locator polynomial based on a data unit of the data stripe, identify a number of data bit errors in the data unit based on the locator polynomial, and determine the identified number of data bit errors in the data unit exceeds the error correction capacity of the BCH error correction circuit by determining the identified number of data bit errors in the data unit is not equal to the degree of the locator polynomial.

15. The nonvolatile memory system of claim 10, wherein the nonvolatile memory module is further configured to store a memory page including a data unit of the data stripe and the error correction code of the data unit into a page frame of the nonvolatile memory module.

16. The nonvolatile memory system of claim 10, wherein the data management module is programmable to select a size of the data stripe by selecting the number of data units in the data stripe.

17. A method comprising:
generating error correction codes for data units of a data stripe by an error correction module of a nonvolatile memory system;
generating a parity unit based on the data units of the data stripe by a data recovery module of the nonvolatile memory system;

receiving a read request for a data unit of the data stripe;

reading the error correction code for the data unit of the data stripe by the error correction module of a nonvolatile memory system upon receipt of the read request;

reading the parity unit for the data strip by the data recovery module of the nonvolatile memory system upon receipt of the read request;

detecting a number of data bit errors in a data unit of the data stripe;

determining whether the number of data bit errors in the data unit exceeds an error correction capacity of the error correction module;

correcting the data bit errors in the data unit by the error correction module based on the error correction code of the data unit if the number of data bit errors in the data unit does not exceed the error correction capacity of the error correction module to generate corrected data units;

providing the corrected data units of the data stripe to the data recovery module if the number of data bit errors of the data unit exceeds the error correction capacity of the error correction module; and recovering the data unit by the data recovery module of the nonvolatile memory system based on the corrected data units of the data stripe and the parity unit if the number of data bit errors in the data unit exceeds the error correction capacity of the error correction module.

18. The method of claim 17, further comprising:
receiving a plurality of data units; and
generating the data stripe by aggregating data units of the plurality of data units into the data stripe.

19. The method of claim 17, further comprising striping the data units of the data stripe across an array of nonvolatile memory units in the nonvolatile memory system.

20. The method of claim 17, further comprising storing a memory page including a data unit of the data stripe and the error correction code of the data unit into a page frame.

* * * * *

UNITED STATES PATENT AND TRADEMARK OFFICE
CERTIFICATE OF CORRECTION

PATENT NO. : 8,707,122 B1
APPLICATION NO. : 13/023336
DATED : April 22, 2014
INVENTOR(S) : Rino Micheloni et al.

It is certified that error appears in the above-identified patent and that said Letters Patent is hereby corrected as shown below:

In the Claims

Claim 17 Column 17 Line 5, delete "strip" and insert --stripe--.

Signed and Sealed this
Ninth Day of December, 2014

Michelle K. Lee
*Deputy Director of the United States Patent and Trademark Office*